United States Patent [19]

Swanson

[11] Patent Number: 4,927,770
[45] Date of Patent: May 22, 1990

[54] METHOD OF FABRICATING BACK SURFACE POINT CONTACT SOLAR CELLS

[75] Inventor: Richard M. Swanson, Los Altos, Calif.

[73] Assignees: Electric Power Research Inst. Corp. of District of Columbia, Palo Alto; Board of Trustees of the Leland Stanford California Corporation, Stanford, both of Calif.

[21] Appl. No.: 272,130

[22] Filed: Nov. 14, 1988

[51] Int. Cl.⁵ ............................................. H01L 31/18
[52] U.S. Cl. ........................................ 437/2; 136/256; 357/30
[58] Field of Search ........................................ 437/2–5; 136/256, 261; 357/30 J, 30 Q

[56] References Cited

U.S. PATENT DOCUMENTS

| | | | |
|---|---|---|---|
| 4,166,918 | 9/1979 | Nostrand | 136/243 |
| 4,167,015 | 9/1979 | Hanak | 357/16 |
| 4,227,942 | 10/1980 | Hall | 136/255 |
| 4,234,352 | 11/1980 | Swanson | 136/253 |
| 4,239,810 | 12/1980 | Alameddine et al. | 437/2 |
| 4,347,264 | 8/1982 | Lindmayer | 430/314 |
| 4,367,368 | 1/1983 | Wolf | 136/255 |
| 4,463,216 | 7/1984 | Nakano et al. | 136/256 |
| 4,512,073 | 4/1985 | Hsu | 437/187 |
| 4,533,933 | 8/1985 | Pellegrini et al. | 357/15 |
| 4,557,037 | 12/1985 | Hanoka et al. | 437/2 |
| 4,585,492 | 4/1986 | Weinberg et al. | 437/247 |
| 4,612,698 | 9/1986 | Gonsiorawski et al. | 437/2 |
| 4,640,001 | 2/1987 | Koiwai et al. | 437/2 |
| 4,665,277 | 5/1987 | Sah et al. | 136/255 |
| 4,667,060 | 5/1987 | Spitzer | 136/255 |

OTHER PUBLICATIONS

F. W. Sexton et al., *J. Electrochem. Soc.*, vol. 129, pp. 2624–2628 (1982).
R. M. Swanson et al., *IEEE Trans. Electron Devices*, vol. ED—31, May, 1984, pp. 661–664.
R. M. Swanson, EPRI AP—2859, Project 790-792, Interim Report, May, 1983.
W. D. Eades et al, *J. Electrochem. Soc.*, vol. 131, Dec., 1984, pp. 3018–3020.
R. M. Swanson, *Solar Cells*, vol. 17, pp. 85–118 (1986).
R. A. Sinton et al., *IEEE Electron Dev. Lett.*, vol. ED-L—6, Aug., 1985, pp. 405–407.
R. A. Sinton et al., *IEEE Electron. Dev. Lett.*, vol. ED-L—7, Oct., 1986, pp. 567–569.
R. A. Sinton, Doctoral Dissertation, Stanford Univ., Feb., 1987.

*Primary Examiner*—Aaron Weisstuch
*Attorney, Agent, or Firm*—Flehr, Hohbach, Test, Albritton & Herbert

[57] ABSTRACT

A back surface point contact silicon solar cell having improved characteristics is fabricated by hydrogenating a silicon-silicon oxide interface where hydrogen atoms are diffused through silicon nitride and silicon oxide passivating layers on the surface of a silicon substrate. In carrying out the hydrogenation, the substrate and passivation layers are placed in a hydrogen atmosphere at an elevated temperature of at least 900° C. whereby hydrogen atoms diffuse through the two passivation layers. Self-alignment techniques are employed in forming small-geometry doped regions in the surface of the silicon substrate for the p-n junctions of the solar cell. Openings are formed through the passivation layers to expose first surface areas on the substrate, and a doped silicon oxide layer is then formed over the passivation layers and on the exposed surface areas. Portions of the first doped layer on the two passivation layers are removed and then second portions of the two passivation layers are removed, thereby exposing second surface areas. A second doped silicon oxide layer is then formed over the passivation layers and on the second exposed surface areas. Dopants from the two doped silicon oxide layers are then diffused into the first and second surface layers to form p and n diffused regions in the surface of the substrate. Thereafter, the first and second doped silicon oxide layers are removed by a preferential etchant which does not remove the silicon nitride layer, thereby exposing the first and second surface areas. A two-level metal interconnect structure is then formed for separately contacting the first surface areas and the second surface areas.

14 Claims, 2 Drawing Sheets

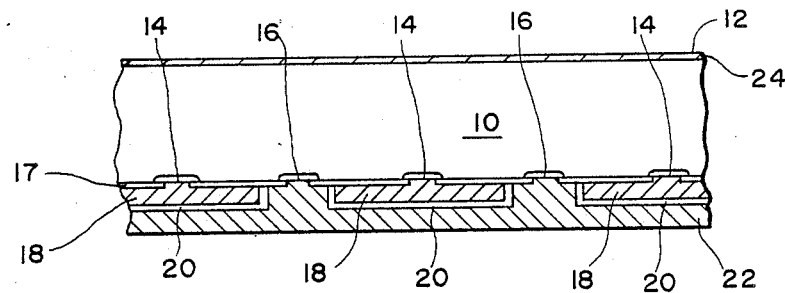
FIG.—1
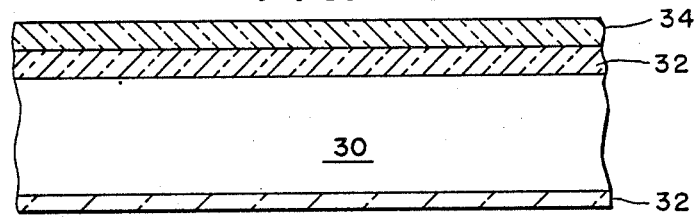
FIG.—2A
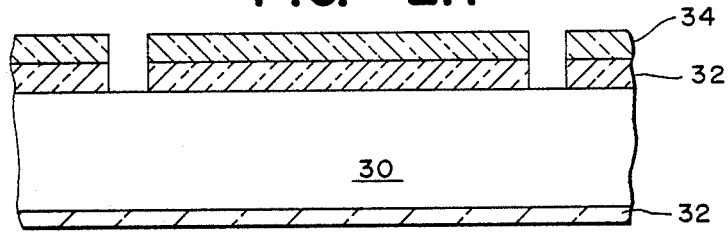
FIG.—2B
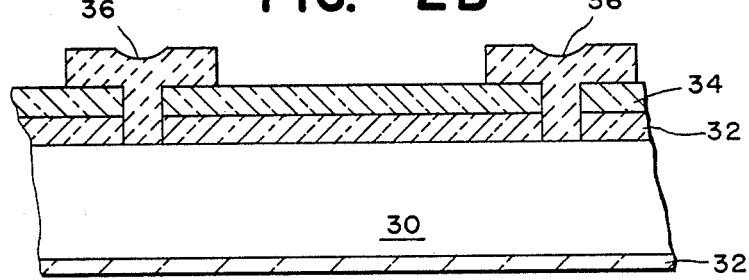
FIG.—2C
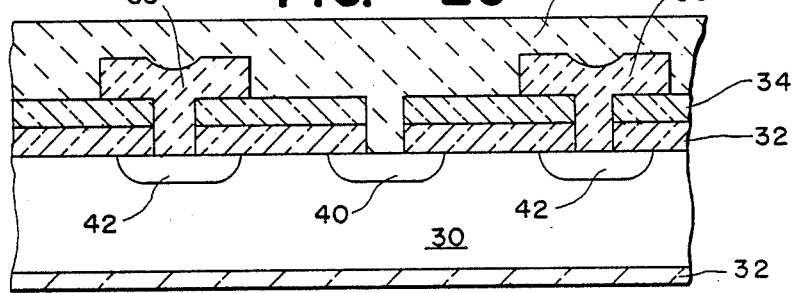
FIG.—2D

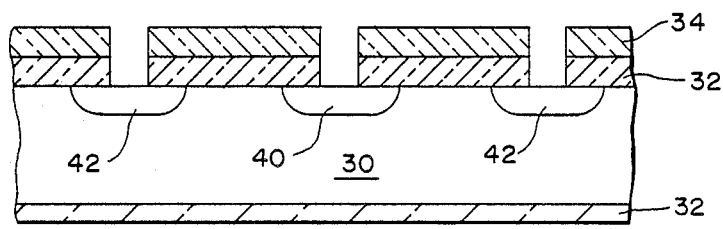
FIG.—2E
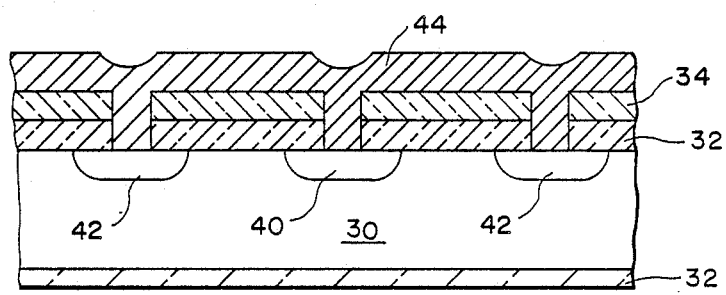
FIG.—2F
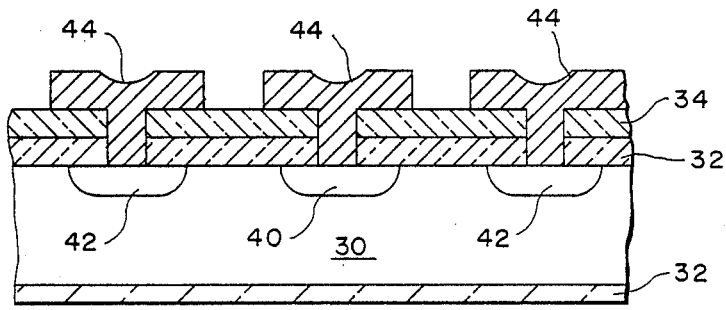
FIG.—2G
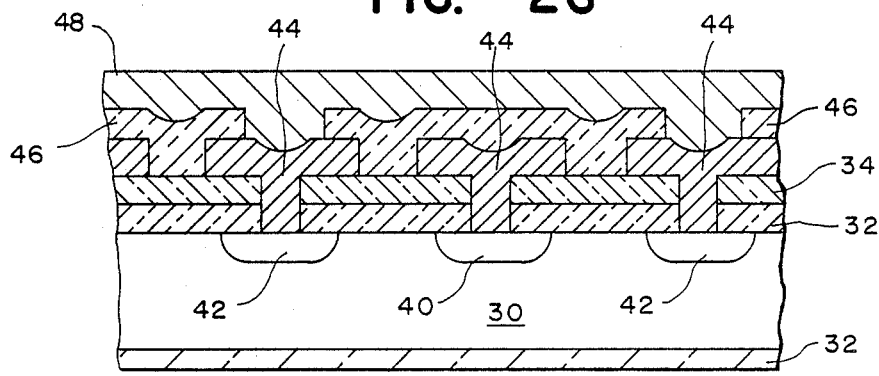
FIG.—2H

METHOD OF FABRICATING BACK SURFACE POINT CONTACT SOLAR CELLS

BACKGROUND OF THE INVENTION

This application is related to copending application Ser. No. 272,105 pending filed Nov. 14, 1988 for "Solar Cell Having Inter-Digitated Contacts and Internal Bypass Diodes", and Ser. No. 272,129 pending filed Nov. 14, 1988 for "Monolithic Series Connected Solar Cells Employing Shorted P-N Junctions for Electrical Isolation".

This invention relates generally to the fabrication of silicon solar cells, and more particularly the invention relates to fabricating back surface point contact solar cells.

The silicon solar cell comprises a plurality of p-and n-conductivity-type regions in a silicon body which generate voltage potential and/or a current when electron-hole pairs are created in a semiconductor body in response to impinging radiation, and the holes and electrons migrate to the p-doped region and the n-doped region, respectively. In a solar cell having interdigitated back surface contacts, the p and n regions are formed in alternating rows with a metal contact provided for contacting all doped regions in one row and with all rows of like doped regions being connected in parallel.

A point contact solar cell has been proposed with the potential for achieving improved energy-conversion efficiency in the neighborhood of 26–28%. See R. M. Swanson, "Point Contact Silicon Solar Cells," EPRI AP-2859 Project 790-2 Interim Report, May 1983. As described therein, in the point contact cell, contact metal touches the silicon substrate in an array of points. The cell is made of lightly-doped silicon with dopant diffusions only at the contact points. The region between contacts, on both top and bottom surfaces, is covered by high-quality silicon oxide for surface passivation. The surfaces are slightly textured and the back side is made reflective to promote light-trapping. Opposite conductivity-type contacts can be on the front and back of a cell, whereupon it is called a front surface cell, or the contacts can be interleaved on the back surface only, whereupon it is called a back surface cell.

As further described by Swanson et al., "Point Contact Solar Cells," IEEE Transactions on Electron Devices, Vol. ED-31, No. 5, May 1984, a back surface cell has been proposed in which a two-layer metallization on the bottom surface provides the metal contacts. Unlike the interdigitated contact cell having alternate p and n fingers, the contact metal touches the silicon only in an array of points on the back surface. The contact areas contain small diffused regions which alternate between n and p type in a checkerboard fashion The top surface and the regions between contacts on the bottom are covered with silicon oxide for surface passivation. The specific design disclosed therein provides low electrical and thermal resistance. The n-type diffusions are contacted by a first layer of aluminum, while p-type diffusions are contacted through holes cut in the first layer. The first and second layers are electrically isolated from each other by a layer of anodic aluminum oxide (A1203).

In fabricating the dual-metal point contact solar cell as disclosed by Swanson et al, supra, a number of processing difficulties have been encountered which have impeded the commercialization of the structures.

SUMMARY OF THE INVENTION

An object of the invention is an improved method of fabricating back surface point contact solar cells.

Another object of the invention is a back surface point contact solar cell having improved operating characteristics including an efficiency up to 30%.

Still another object of the invention is an improved method of reducing the recombination velocity of electron-hole pairs in a solar cell substrate.

A feature of the invention is the provision of doped regions of smaller geometry provided by a self-alignment of the diffused regions during fabrication.

Another feature of the invention is the hydrogenating the silicon-silicon oxide interface of a point contact solar cell after formation of a passivating silicon nitride surface layer.

Briefly, in accordance with the invention, in fabricating a back surface point contact silicon solar cell, a pattern of p-type and n-type diffused regions are formed in the back surface of a silicon substrate through a self-aligned process, whereby alignment tolerance is reduced and facilitates smaller geometry diffused regions. A silicon oxide passivation layer is formed over the back surface, and a passivating silicon nitride layer is formed over the silicon oxide layer and facilitates the self-aligned diffusion processing.

Importantly, the silicon oxide-silicon interface can be hydrogenated following the formation of the silicon nitride layer without requiring ion implantation. The silicon nitride passivated silicon substrate is subjected to a high-temperature (900° C.+) in a hydrogen environment. At this temperature the hydrogen will penetrate the silicon nitride and silicon oxide passivating layers to reduce the recombination velocity of electron-hole pairs at the silicon oxide-silicon interface to acceptable levels.

The invention and objects and features thereof will be more readily apparent from the following detailed description and appended claims when taken with the drawing.

BRIEF DESCRIPTION OF THE DRAWING

FIG. 1 is a cross-section of a back surface point contact silicon solar cell made in accordance with the present invention.

FIGS. 2A–2H are section views illustrating the steps in fabricating the device of FIG. 1.

DETAILED DESCRIPTION OF ILLUSTRATIVE EMBODIMENT

FIG. 1 is a section view of a back surface point contact silicon solar cell employing double metallization and fabricated using the method of the present invention.

The structure of FIG. 1 is described by Swanson et al. supra. The cell includes a single-crystal silicon substrate 10 having a resistance of approximately 200 Ω-cm. The top surface of the substrate has a layer 12 of silicon oxide, and the bottom surface includes alternating n-doped regions 14 and p-doped regions 16. The bottom surface between the diffused regions 14, 16 is coated with a passivating layer 17 of silicon oxide. Aluminum contacts 18 are made to the n-doped regions 14. The surfaces of the aluminum contacts 18 are oxidized at 20 and a second aluminum metallization 22 contacts the p-doped regions 16. An insulation layer 24 is provided on the top surface to reduce surface recombination of holes and electrons. The layer can comprise silicon oxide with a fixed charge therein to establish an electrical field in the surface region. Alternatively, a doped surface layer can be provided on substrate 10. While the surface layer is not essential to the cell operation, it gives stability to the cell operation in sunlight.

As described by Swanson et al., the photovoltaic cell is designed for high-concentration applications and has the potential for achieving energy conversion efficiencies in the order of 28% at a design operating point of 500×geometric concentration and 60° C. cell temperature. The alternating n and p regions 14 and 16 form a polka-dot array on the bottom surface. The two-layer metallization 18 and 20 provides the contacts and also functions as a reflective surface for photons entering from the top surface and passing through the substrate 10.

As noted above, realization of the full potential of the device of FIG. 1 requires manufacturing techniques not heretofore appreciated with construction of the solar cell, especially in the reduction of electron-hole recombination velocity and the reduction of the geometric size of the diffused contacts due to alignment tolerances in the requisite photoresist masking and etching techniques. These difficulties are overcome in accordance with the present invention as illustrated in the process steps of FIGS. 2A-2H.

Referring now to FIG. 2A, in fabricating the device of FIG. 1 in accordance with the invention, the silicon substrate 30 has layers of silicon oxide 32 formed on the surfaces, and a layer 34 of silicon nitride is formed by deposition on the top surface of the silicon oxide 32. The silicon nitride provides additional passivation and facilitates a self-alignment of the diffused regions and metallization as will be described.

Thereafter, as illustrated in FIG. 2B, openings are formed through the silicon nitride and silicon oxide layers to expose surface portions on the substrate 30, and, as illustrated in FIG. 2C, phosphorus-doped glass 36 is formed on the surface of the silicon nitride and in the openings therethrough. Thereafter, a second plurality of openings are formed between the first openings, and a boron-doped glass 38 is formed over the top surface and into the new openings as shown in FIG. 2D. The structure is then heated to a temperature of approximately 900° C. and dopants from the doped oxide layers 36, 38 diffuse into the surface of the substrate 30 forming p-doped regions 40 and n-doped regions 42.

Simultaneously or sequentially, the interface between the oxide 32 and the substrate 30 is hydrogenated by exposing the structure to a hydrogen environment at a temperature in excess of 900° C. Heretofore, it was considered necessary to use ion implantation of hydrogen atoms to penetrate a silicon nitride layer, or alternatively to hydrogenate the silicon oxide-silicon interface prior to silicon nitride formation. However, the subsequent silicon nitride formation has deleterious effects on the hydrogenated interface. In accordance with one aspect of the invention, the high-temperature processing of the structure in a hydrogen environment facilitates the hydrogenation of the interface without causing deleterious effects on the structure.

In accordance with another aspect of the invention, the structure as shown in FIG. 2D is then exposed to a silicon oxide etch to remove all of the exposed oxide 36, 38 but not etching the silicon nitride layer 34. Thus, self-aligned openings are formed through the silicon nitride 34 and silicon oxide 32 layers to the diffused regions 40 and 42 as shown in FIG. 2E.

Thereafter, as shown in FIG. 2F, metal layer 44, sputtered aluminum for example, is applied and contacts the doped regions 40 and 42. The metal layer 44 is etched as shown in FIG. 2G whereby the metallization 44 contacts all of the doped regions 40 and all doped regions 42 have separate contacts. Thereafter, as shown in FIG. 2H, an insulative layer 46 of silicon oxide is deposited and etched to expose the metal contacts to the doped regions 42, and then a second metal layer 48 of aluminum is deposited to interconnect all of the doped regions 42. This completes the cell fabrication.

The method of hydrogenating the silicon oxide-silicon interface and the formation of self-aligned contacts in accordance with the invention facilitates the fabrication of a back surface point contact silicon solar cell with the resulting structure having enhanced operating characteristics.

While the invention has been described with reference to a specific embodiment, the description is illustrative of the invention and is not to be construed as limiting the invention. Various modifications and applications may occur to those skilled in the art without departing from the true spirit and scope of the invention as defined by the appended claims.

I claim:

1. A method of fabricating a back surface point contact solar cell, comprising the steps of
    (a) providing a substrate of silicon having two major opposing surfaces,
    (b) forming a silicon oxide layer on at least a first of said major surfaces,
    (c) forming a silicon nitride layer on said silicon oxide layer,
    (d) removing first portions of said layers thereby exposing first surface areas on said first major surface,
    (e) forming a first doped layer with a first conductivity type dopant therein on said surface areas,
    (f) removing second portions of said layers, thereby exposing second surface areas on said first major surface,
    (g) forming a second doped layer with a second conductivity type dopant therein over on said second surface areas,
    (h) heating said substrate and thereby diffusing dopant from said first layer into said first surface areas and diffusing dopant from said second doped layer into said second surface areas,
    (i) subjecting said substrate and said layers to an elevated temperature of at least 900° C. in a hydrogen atmosphere, thereby hydrogenating the interface between said major surface and said silicon oxide layer,
    (j) removing said first and second doped layers by a preferential etchant which does not remove said silicon nitride, and
    (k) forming a two-level metal interconnect structure for separately contacting said first surface areas and said second surface areas.

2. The method as defined by claim 1 wherein step (k) includes forming a first metal layer contacting said first and second surface areas selectively etching said first metal layer to electrically isolate all of said first surface areas forming an insulative layer over said first metal layer, and forming a second metal layer over said insulative layer and in electrical contact with all of said first surface areas.

3. The method as defined by claim 1 wherein step (k) includes forming a first aluminum layer contacting said first surface areas, oxidizing said first aluminum layer, and forming a second aluminum layer contacting said second surface areas.

4. The method as defined by claim 1 wherein said first and second doped layer comprise silicon oxide.

5. The method as defined by claim 1 wherein the steps of forming said first and second doped layers and the diffusing of dopants therefrom are performed sequentially.

6. The method as defined by claim 1 wherein steps (h) and (i) are carried out concurrently.

7. The method as defined by claim 1 wherein step (b) includes forming a silicon oxide layer on the second major surface.

8. The method as defined by claim 7 wherein step (b) further includes doping the silicon oxide layer on the second major surface.

9. The method as defined by claim 7 wherein step (b) further includes establishing an electrical charge in the silicon oxide layer on the second major surface.

10. In the fabrication of a back surface point contact solar cell including a silicon substrate and employing silicon oxide and silicon nitride passivation layers, a method of reducing the recombination velocity of electron-holes pairs at the interface of the silicon substrate and the silicon oxide layer, comprising the steps of placing the silicon substrate with silicon oxide and silicon nitride layers thereon in a hydrogen atmosphere, and heating said silicon substrate in said atmosphere at a temperature of at least 900° C. to diffuse hydrogen atoms through said silicon nitride layer and through said silicon oxide layer to the interface of said silicon oxide layer and said substrate.

11. A method of forming first and second diffused regions of opposite conductivity type in a surface of a silicon substrate for fabricating a back surface point contact solar cell, comprising the steps of (a) providing a substrate of silicon having two major opposing surfaces, (b) forming a silicon oxide layer on a first of said major surfaces, (c) forming a silicon nitride layer on said silicon oxide layer, (d) removing first portions of said layers, thereby exposing first surface areas on said first major surface, (e) forming a first doped silicon oxide layer with a first conductivity type dopant therein over said layers and on said first surface areas, (f) removing second portions of said layers, thereby exposing second surface areas on said first major surface, (g) forming a second doped silicon oxide layer with a second conductivity type dopant therein over said layers and on said second surface areas, (h) heating said substrate and thereby diffusing dopant from said first doped layer into said first surface areas and diffusing dopant from said second doped layer into said second surface areas, and (i) removing said first and second doped layers by a preferential etchant which does not remove said silicon nitride.

12. The method as defined by claim 11 and further including: (j) forming a two-level metal interconnect structure for separately contacting said first surface areas and said second surface areas.

13. The method as defined by claim 12 wherein step (j) includes forming a first metal layer contacting said first and second surface areas selectively etching said first metal layer to electrically isolate all of said first surface areas forming an insulative layer over said first metal layer, and forming a second metal layer over said insulative layer and in electrical contact with all of said first surface areas.

14. The method as defined by claim 12 wherein step (j) includes forming a first aluminum layer contacting said first surface areas, oxidizing said first aluminum layer, and forming a second aluminum layer contacting said second surface areas.

* * * * *